United States Patent
Wang et al.

(10) Patent No.: US 7,486,546 B2
(45) Date of Patent: Feb. 3, 2009

(54) MULTI-STATE SENSE AMPLIFIER

(75) Inventors: Min-Chuan Wang, Taichung (TW);
Chih-Sheng Lin, Tainan County (TW);
Chia-Pao Chang, Taipei County (TW);
Keng-Li Su, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 60 days.

(21) Appl. No.: 11/806,636

(22) Filed: Jun. 1, 2007

(65) Prior Publication Data
US 2008/0007992 A1    Jan. 10, 2008

(30) Foreign Application Priority Data
Jul. 6, 2006    (TW) .............................. 95124607 A

(51) Int. Cl.
*G11C 11/00* (2006.01)
(52) U.S. Cl. ...................... 365/158; 365/207; 365/210.1
(58) Field of Classification Search .................. 365/158, 365/207, 210.1
See application file for complete search history.

(56) References Cited

U.S. PATENT DOCUMENTS

| | | | |
|---|---|---|---|
| 6,700,814 B1 | 3/2004 | Nahas et al. | |
| 6,791,887 B2 | 9/2004 | Hung et al. | |
| 2004/0228179 A1 | 11/2004 | Pagliato et al. | |
| 2006/0050584 A1 | 3/2006 | Gogl et al. | |
| 2006/0104136 A1 | 5/2006 | Gogl et al. | |
| 2007/0247892 A1* | 10/2007 | Egerer | 365/148 |

FOREIGN PATENT DOCUMENTS

| | | | |
|---|---|---|---|
| JP | 2003-297090 A | 10/2003 |
| JP | 2005-259301 A | 9/2005 |

* cited by examiner

*Primary Examiner*—Hoai V Ho
(74) *Attorney, Agent, or Firm*—Birch, Stewart, Kolasch & Birch, LLP

(57) ABSTRACT

The invention provides a multi-state sense amplifier, coupled to at least one memory cell with changeable resistance and a plurality of reference cells. The first current mirror circuit, coupled to the output terminal of the memory cell, generates a second memory cell current at a first node according to a first memory cell current through the memory cell. The second current mirror circuit, coupled to the output terminal of the reference cells, generates a plurality of second reference currents at a plurality of second nodes according to a plurality of first reference currents through the reference cells. The load circuit, coupled to the first node, the second nodes, and a ground, provides equal loads for the second memory cell current and the second reference currents to respectively generate a memory cell voltage at the first node and a plurality of reference voltages at the second nodes.

30 Claims, 9 Drawing Sheets

| State of an MRAM Cell | First Resistance of the MRAM Cell | Second Resistance of the MRAM Cell | Total Resistance of the MRAM Cell | Data Stored in the MRAM Cell |
|---|---|---|---|---|
| State 1 | $R_{1max}$ | $R_{2max}$ | $R_{1max}//R_{2max}$ | 11 |
| State 2 | $R_{1max}$ | $R_{2min}$ | $R_{1max}//R_{2min}$ | 10 |
| State 3 | $R_{1min}$ | $R_{2max}$ | $R_{1min}//R_{2max}$ | 01 |
| State 4 | $R_{1min}$ | $R_{2min}$ | $R_{1min}//R_{2min}$ | 00 |

FIG. 2 (RELATED ART)

MULTI-STATE SENSE AMPLIFIER

BACKGROUND OF THE INVENTION

1. Field of the Invention

The invention relates to memory and more particularly to memory with changeable resistance.

2. Description of the Related Art

Non-volatile Magnetic Random Access Memory (MRAM), unlike memory which stores data in the form of charge or current, stores data with magnetic storage cells. Because MRAM provides high cell density and access speed, it gained popularity in memory fabrication.

FIG. 1 shows a conventional MRAM cell 100 comprising a transistor 102 and two Magnetic Tunnel Junction (MTJ) devices 104 and 106. The MTJ devices 104 and 106 are coupled in parallel between a read bit line RBL and a node 108. MTJ devices typically comprise a plurality of interleaved ferromagnetic layers and insulating layers. A magnetic field applied to the MRAM cell 100 shifts the polarity of the ferromagnetic layers, changing the resistance of the MTJ devices 104 and 106. Thus, the MTJ devices 104 and 106 can be switched between two levels of resistance.

A transistor 102 is coupled between the node 108 and a ground. The gate of the transistor 102 is coupled to a word line WL. When a high voltage is applied to the word line WL to turn on the transistor 102, the MTJ devices 104 and 106 are connected in parallel between the read bit line RBL and ground. The read bit line RBL is biased by a constant voltage and coupled to a sense amplifier, such that current level through the read bit line RBL changes with the resistance of the MTJ devices 104 and 106. The sense amplifier can then read data stored in MRAM cell 100 by detecting the current level. Because the sizes of the two MTJ devices 104 and 106 are different, the changeable resistance level of the MTJ devices is also different. For example, if the MTJ device 104 can be switched between resistance level $R_{1max}$ and $R_{1min}$, and the MTJ device 106 can be switched between resistance level $R_{2max}$ and $R_{2min}$, the total resistance of the MRAM cell 100 can then be switched among four levels of $R_{1max}//R_{2max}$, $R_{1max}//R_{2min}$, $R_{1min}//R_{2max}$, and $R_{1min}//R_{2min}$. Accordingly, the MRAM cell 100 has four memory states, each capable of storing 2 bits of data. FIG. 2 is a table 200 showing the relationship between the resistance level of the MRAM cell 100 and corresponding data stored in the MRAM cell 100. The data stored in the MRAM cell 100 is respectively 11, 10, 01, and 00.

Because an MRAM comprises a plurality of MRAM cells 100, an output circuit must be coupled to the bit line to detect data stored in a specific MRAM cell. The design of the output circuit heavily affects access time and performance of the MRAM. If an output circuit detects the current or voltage of the bit line with a multi-state sense amplifier, the access time is greatly reduced and the performance of the MRAM improved.

The multiple bit lines and word lines of a memory induce parasitic capacitance. When a memory cell is turned on, the memory cell is directly coupled to the multi-state sense amplifier, and the voltage drops across the MTJ devices induce a current along the path between the memory cell and the multi-state sense amplifier. According to the charge conservation theorem $Q=C \times V=I \times t$, when the memory cell is turned on, the current cannot immediately charge the parasitic capacitance coupled to the current path to force the transistors of the sense amplifier into triode regions, and the output voltage of the sense amplifier is pulled up to a logic high level, increasing the access time of the MRAM.

A method is thus provided for ameliorating the described problems. The method couples the output terminals of reference cells to switches to be turned on only when the memory cell is turned on to clamp the voltage of the output terminals of the reference cells to a certain voltage. Thus, the voltages of transistors of the sense amplifier are prevented from being pulled up to the logic high level reducing access time by half.

BRIEF SUMMARY OF THE INVENTION

The invention, accordingly, provides a multi-state sense amplifier, coupled to at least one memory cell with changeable resistance and a plurality of reference cells. An exemplary embodiment of the multi-state sense amplifier comprises a first current mirror circuit, a second current mirror circuit, and a load circuit. The first current mirror circuit, coupled to the output terminal of the memory cell, generates a second memory cell current at a first node according to a first memory cell current through the memory cell. The second current mirror circuit, coupled to the output terminal of the reference cells, generates a plurality of second reference currents at a plurality of second nodes according to a plurality of first reference currents through the reference cells. The load circuit, coupled to the first node, the second nodes, and a ground, provides equal loads for the second memory cell current and the second reference currents to respectively generate memory cell voltage at the first node and a plurality of reference voltages at the second nodes.

The invention also provides a multi-state sense amplifier coupled to at least one memory cell with changeable resistance and a plurality of reference cells. An exemplary embodiment of the multi-state sense amplifier comprises a first current mirror circuit, a second current mirror circuit, a third current mirror circuit, and a load circuit. The first current mirror circuit, coupled to the output terminal of the memory cell, generates at least one second memory cell current at one first node and a third memory cell current at a third node according to a first memory cell current through the memory cell. The second current mirror circuit, coupled to the output terminal of the reference cells, generates a plurality of second reference currents at a plurality of second nodes according to a plurality of first reference currents through the reference cells. The third current mirror circuit, coupled to the third node and the second nodes, draws a plurality of fourth memory cell currents equal to the third memory cell current from the second nodes to leave a plurality of remainder currents through the second nodes. The load circuit, coupled to the first node, the second nodes, and a ground, provides equal loads for the second memory cell current and the remainder currents to respectively generate at least one memory cell voltage at the first node and a plurality of reference voltage at the second nodes.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 2 is a table showing the relationship between the resistance level of the MRAM cell and corresponding data stored in the MRAM cell of FIG. 1;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
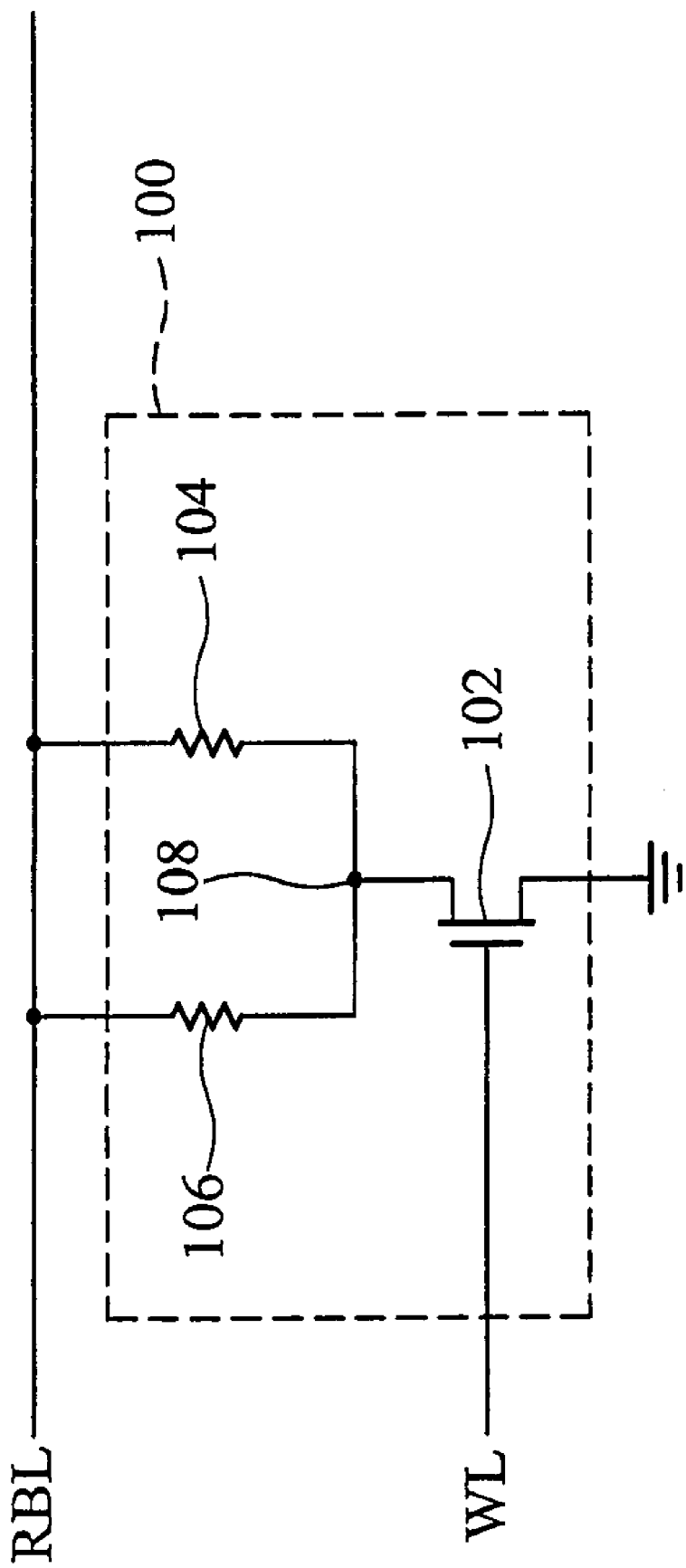
FIG. 1 shows a conventional MRAM cell.
Figure 3:
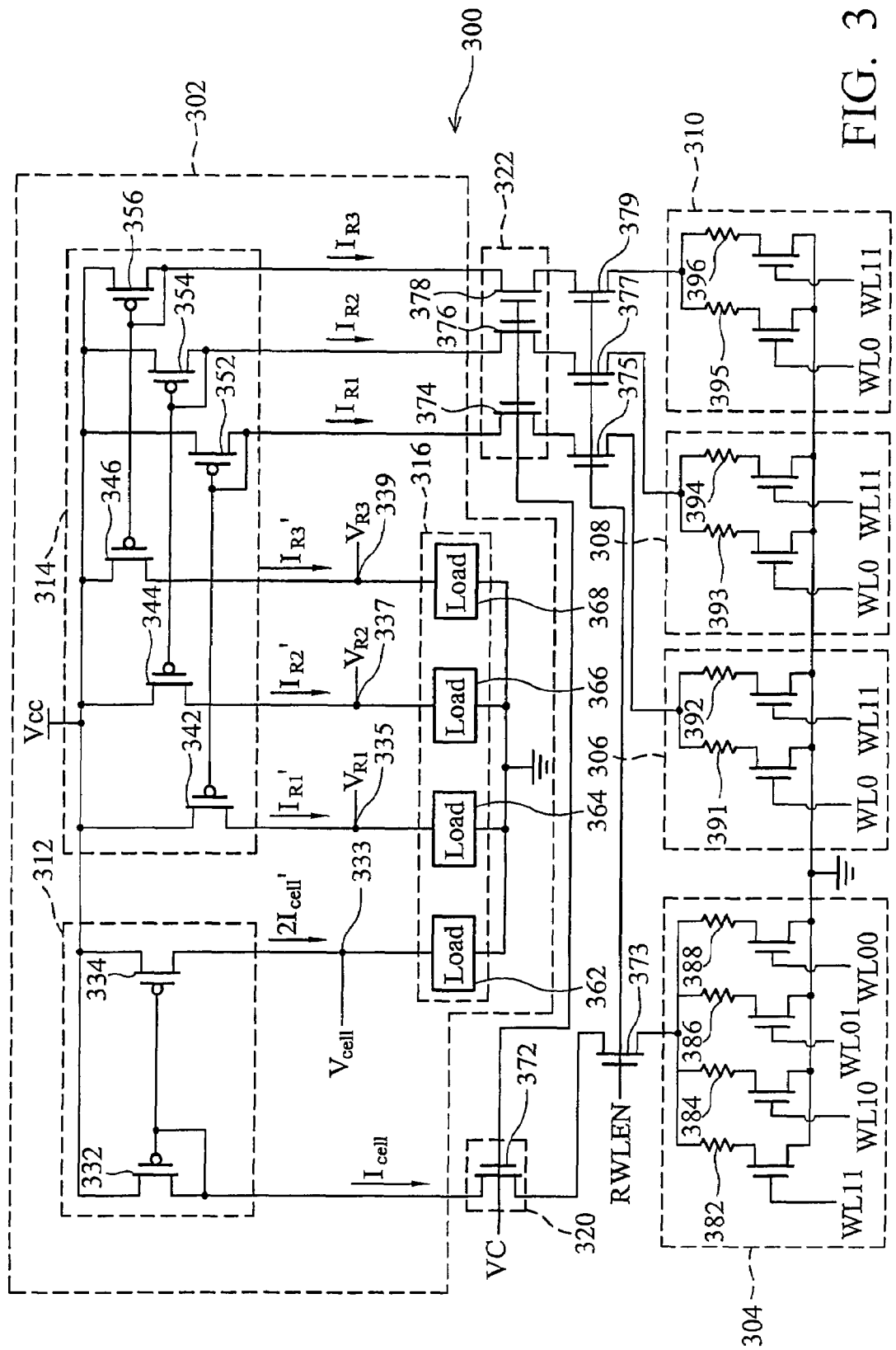
FIG. 3 is a circuit diagram of an embodiment of a portion of an MRAM 300 according to the invention.

FIG. 3 is a circuit diagram of an embodiment of a portion of an MRAM 300 according to the invention. MRAM 300 comprises a four-state sense amplifier 302, at least one four-state memory cell 304, reference cells 306, 308, and 310, a source follower 320, and a source follower circuit 322. MRAM 300 comprises a plurality of MRAM cells 304, each having a structure similar to MRAM cell 100 of FIG. 1, and coupled between a bit line and a ground, wherein the bit line is further coupled to the sense amplifier 302 through the source follower 320. When an MRAM cell 304 is selected by a word line, the transistor 102 of the selected MRAM cell 304 is turned on to couple the MTJ devices 104 and 106 between the sense amplifier 302 and the ground. Thus, the sense amplifier 302 can detect the resistance of the selected MRAM cell for reading stored data.

For brevity, FIG. 3 shows only the selected MRAM cell 304. Because the resistance of the MRAM cell 304 can be switched among four levels, the four resistors 382, 384, 386, and 388 each represent one of four resistance levels, $R_{1max}//R_{2max}$, $R_{1max}//R_{2min}$, $R_{1min}//R_{2max}$, and $R_{1min}//R_{2min}$ respectively. The gates of transistors coupled in series with the four resistors 382, 384, 386, and 388 are respectively coupled to word lines WL11, WL10, WL01, and WL00. Each word line is selected to turn on the corresponding transistor to couple the corresponding resistor 382, 384, 386, or 388 between the ground and the sense amplifier 302. For example, when the word line WL10 is selected, a corresponding transistor is turned on to couple the resistor 384 between the ground and the sense amplifier 302, and the total resistance of the MRAM cell 304 is $R_{1max}//R_{2min}$. The simplified circuit of MRAM cell 304 shown in FIG. 3 is provided for illustration only, and the real circuit structure of the MRAM cell 304 may be similar to the MRAM cell 100 shown in FIG. 1.

Reference cells 306, 308, and 310 each have a different resistance that can be compared with the resistance of MRAM cell 304 to obtain stored data. Each of the reference cells is formed by multiple resistors coupled between the output terminals thereof and a ground. In one embodiment, each of the reference cells comprises two resistors respectively corresponding to one of the four resistances of the MRAM cell 304. For example, the reference cell 306 can comprise a resistor 391 having resistance of $R_{1min}//R_{2min}$ and a resistor 392 having resistance of $R_{1min}//R_{2max}$, the reference cell 308 can comprise a resistor 393 having resistance of $R_{1min}//R_{2max}$ and a resistor 394 having resistance of $R_{1max}//R_{2min}$, and the reference cell 310 can comprise a resistor 395 having resistance of $R_{1max}//R_{2min}$ and a resistor 396 having resistance of $R_{1max}//R_{2max}$. Because the MRAM cell 304 has four ($2^2$) resistance levels, the number of the reference cells is three ($2^2-1=3$). When one of the word lines WL11, WL10, WL01, WL00 is selected, the word lines WL0 and WL1 are selected at the same time to couple the two resistors of the reference cells in parallel between the sense amplifier 302 and ground.

A transistor 373 and a source follower 320 are coupled between the sense amplifier 302 and the bit line of the output terminal of the MRAM cell 304. The source follower 312 comprises an NMOS transistor 362, having a gate coupled to a clamp voltage $V_C$, and a source coupled to the output terminal of the MRAM cell 304 through the transistor 373. The clamp voltage $V_C$ is about 0.7V. Because the voltage of the source of the NMOS transistor 372 is determined according to the clamp voltage $V_C$ of about 0.7V, the voltage drop across the MRAM cell 304 is kept at a constant of about 0.3V. The transistor 373 has a gate coupled to a read-word-line enable signal RWLEN which turns on the transistor 373 to couple the MRAM cell 304 to the sense amplifier 302. Because the voltage drop across the MRAM cell 304 is kept constant, the memory cell current $I_{cell}$ through the MRAM cell 304 is determined according to the resistance of the MRAM cell 304.

Accordingly, the sense amplifier 302 is coupled to the output terminals of the reference cells 306, 308, and 310 through the source follower circuit 322 and transistors 375, 377, and 379. The source follower circuit 322 includes NMOS transistors 374, 376, and 378, having gates coupled to the clamp voltage $V_C$. Because the voltage of the sources of the NMOS transistor 374, 376, and 378 are determined according to the clamp voltage $V_C$, the voltage drops across the reference cells 306, 308, and 310 are kept at a constant of about 0.3V. The transistors 375, 377, and 379 are triggered by the read-word-line enable signal RWLEN to couple the reference cells 306, 308, and 310 to the sense amplifier 302. Because the voltage drops across the reference cells 306, 308, and 310 are kept identical to the voltage drop across the memory cell 304, the reference currents $I_{R1}$, $I_{R2}$, and $I_{R3}$ through the reference cells 306, 308, and 310 are determined according to the resistance of the reference cells 306, 308, and 310.

The sense amplifier 302 is a four-state sense amplifier and generates a memory cell voltage $V_{cell}$ and a plurality of reference voltages $V_{R1}$, $V_{R2}$, and $V_{R3}$ according to the resistance of the MRAM cell 304 and the reference cells 306, 308, and 310. The sense amplifier 302 comprises a first current mirror circuit 312, a second current mirror circuit 314, and a load circuit 316. The first current mirror circuit 312 receives the first memory cell current $I_{cell}$ generated by the MRAM cell 304 and generates a second memory cell current $2I_{cell}'$ with a current level equal to twice the current level of the first memory cell current $I_{cell}$. The first current mirror circuit 312 comprises PMOS transistors 332 and 334. The PMOS transistor 332 has a source coupled to a voltage source Vcc and a gate and a drain coupled to the memory cell 304 through the source follower 320 and receives the first memory cell current $I_{cell}$. The PMOS transistor 334 has a source coupled to the voltage source Vcc, a gate coupled to the gate of the PMOS transistor 332, and a drain coupled to a first node 333. Because the voltages of the gates and sources of the PMOS transistors 332 and 334 are equal, and the width of the PMOS transistor 334 is twice the width of the PMOS transistor 332, the level of the second memory cell current $2I_{cell}'$ generated by the PMOS transistor 334 is double the level of the first memory cell current $I_{cell}$ generated by the PMOS transistor 332.

The second current mirror circuit 314 receives the first reference currents $I_{R1}$, $I_{R2}$, and $I_{R3}$ generated by the reference cells 306, 308, and 310 and generates second reference currents $I_{R1}'$, $I_{R2}'$, and $I_{R3}'$ respectively with the same current levels as the first reference currents $I_{R1}$, $I_{R2}$, and $I_{R3}$. The second current mirror circuit 314 comprises PMOS transistors 342, 344, 346, 352, 354, and 356, wherein the PMOS transistors 342 and 352, 344 and 354, and 346 and 356 respectively form a current mirror generating one of the second reference currents $I_{R1}'$, $I_{R2}'$, and $I_{R3}'$. For example, the PMOS transistors 342 and 352 can have sources coupled to the voltage source Vcc, and gates coupled together. The drain of the PMOS transistor 342 is coupled to the second node 335, and the drain of the PMOS transistor 352 is coupled to the output terminal of the reference cell 306 for reception of the first reference current $I_{R1}$. Because the voltage levels of the gates and sources of the PMOS transistors 342 and 352 are the same, the level of the second reference current $I_{R1}'$ generated by the drain of the PMOS transistor 342 is substantially identical to the level of the first reference current $I_{R1}$ generated by the drain of the PMOS transistor 352. Accordingly, the levels of the second reference currents $I_{R2}'$ and $I_{R3}'$ generated by the drains of the PMOS transistors 344 and 346 at the second nodes 337 and 339 are substantially identical to the levels of the first reference currents $I_{R2}$ and $I_{R3}$ generated by the drains of the PMOS transistors 354 and 356.

The load circuit 316 provides equal loads for the second memory cell current $2I_{cell}'$ and the second reference currents $I_{R1}'$, $I_{R2}'$, and $I_{R3}'$, and generates the memory cell voltage $V_{cell}$ at the first node 333 and the reference voltages $V_{R1}$, $V_{R2}$, and $V_{R3}$ at second nodes 335, 337, and 339. The load circuit 316 comprises load elements 362, 364, 366, and 368 with equal resistance, respectively coupled between the ground and the first node 333 and the second nodes 335, 337, and 339. Thus, the ratios of the reference voltages $V_{R1}$, $V_{R2}$, and $V_{R3}$ to the memory cell voltage $V_{cell}$ are respectively equal to the ratios of the second reference currents $I_{R1}'$, $I_{R2}'$, and $I_{R3}'$ to the second memory cell current $2I_{cell}'$.

Figure 4:
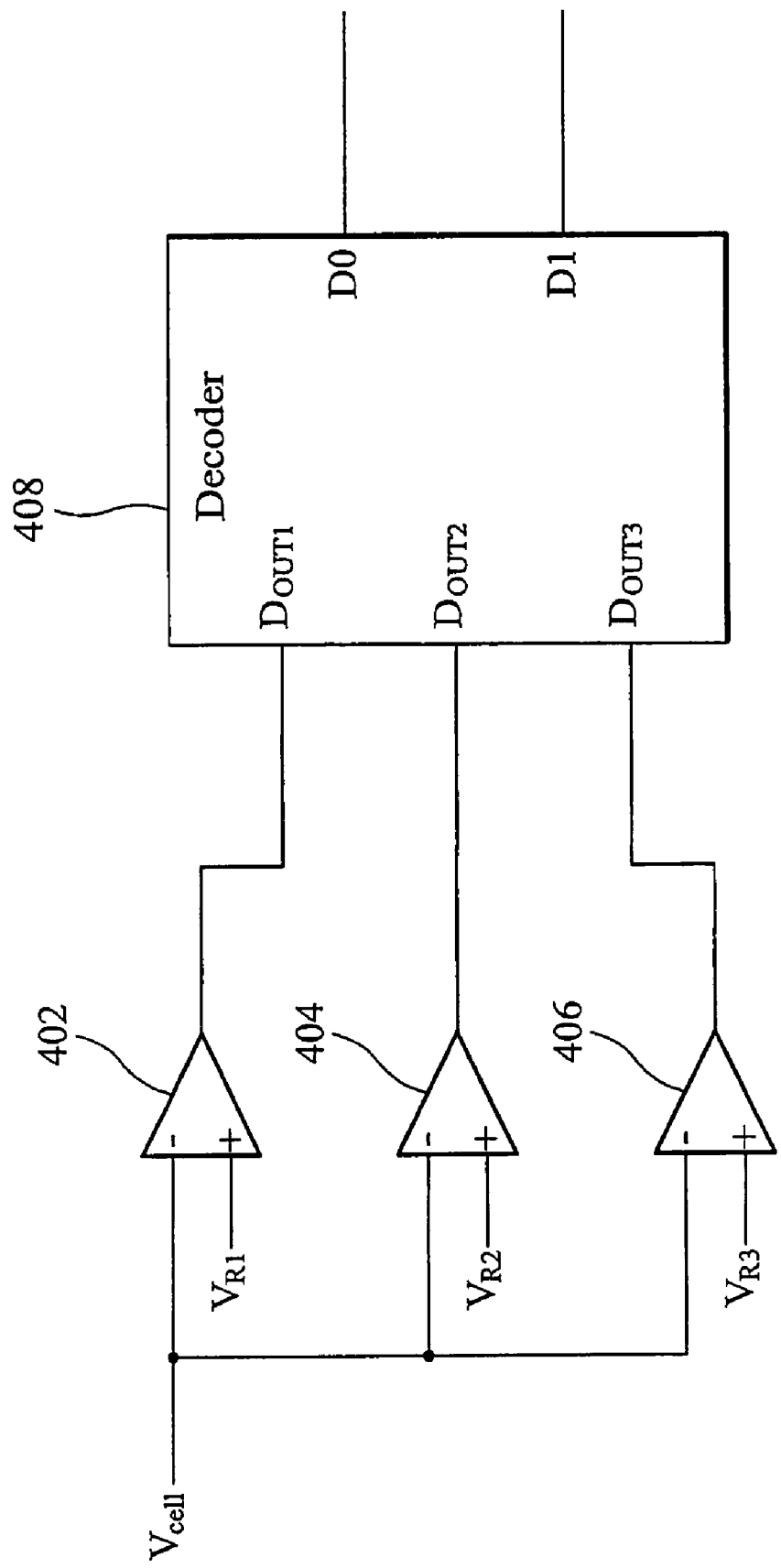
FIG. 4 shows comparators and a decoder of the MRAMs of FIGS. 3 and 6 according to the invention.

After the sense amplifier 302 generates the memory cell voltage $V_{cell}$ and the reference voltages $V_{R1}$, $V_{R2}$, and $V_{R3}$, the memory cell voltage $V_{cell}$ and the reference voltages $V_{R1}$, $V_{R2}$, and $V_{R3}$ can be further processed by comparators and decoders to obtain data bits stored in the memory cell 304. FIG. 4 shows the comparators 402, 404, and 406 and the decoder 408 of the MRAM 300 according to the invention. The comparators 402, 404, and 406 compare the memory cell voltage $V_{cell}$ with the reference voltages $V_{R1}$, $V_{R2}$, and $V_{R3}$ to generate the comparison result signals $D_{OUT1}$, $D_{OUT2}$, and $DOUT_3$. The decoder 408 then decodes the comparison results signals $D_{OUT1}$, $D_{OUT2}$, and $DOUT_3$ to obtain the 2-bit data D0 and D1 stored in the MRAM cell 304.

Figure 5:
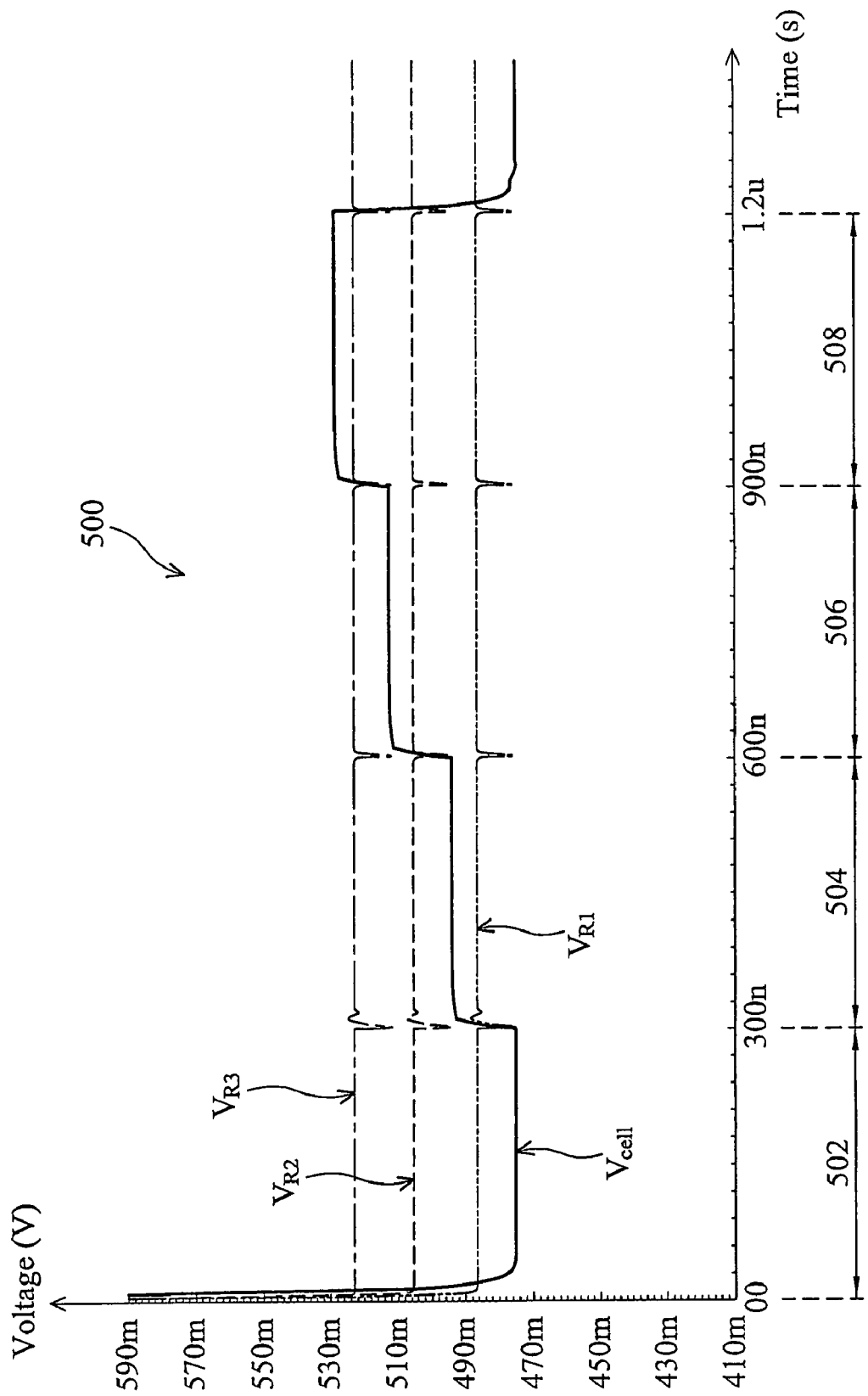
FIG. 5 shows a relationship between a memory cell voltage and the corresponding reference voltages generated by the sense amplifier of FIG. 3.

FIG. 5 shows a relationship between a memory cell voltage $V_{cell}$ and the corresponding reference voltages $V_{R1}$, $V_{R2}$, and $V_{R3}$ generated by the sense amplifier 302 of FIG. 3. During the periods 502, 504, 506, and 508, the word lines WL00, WL01, WL10, and WL11 are respectively enabled. Thus, the resistance of the MRAM cell 304 during the periods 502, 504, 506, and 508 is respectively the resistance of resistors 382, 384, 386, and 388. FIG. 5 shows that the relative levels between the memory cell voltage $V_{cell}$ and the corresponding reference voltages $V_{R1}$, $V_{R2}$, and $V_{R3}$ are different during the periods 502, 504, 506, and 508. Because the relative levels between the memory cell voltage $V_{cell}$ and the corresponding reference voltages $V_{R1}$, $V_{R2}$, and $V_{R3}$ reflect the relative levels of the resistance of the memory cell 304 and the reference cells 306, 308, and 310, the comparators 402, 404, and 406 and the decoder 408 can determine the resistance of the memory cell 304 in comparison with the resistance of the memory cells 306, 308, and 310 according to the memory cell voltage $V_{cell}$ and the corresponding reference voltages $V_{R1}$, $V_{R2}$, and $V_{R3}$, thus obtaining the data bits stored in the memory cell 304. Additionally, the sense amplifier 302 reduces access time of the memory cell 304 and improves performance of the MRAM 300.

Figure 6:
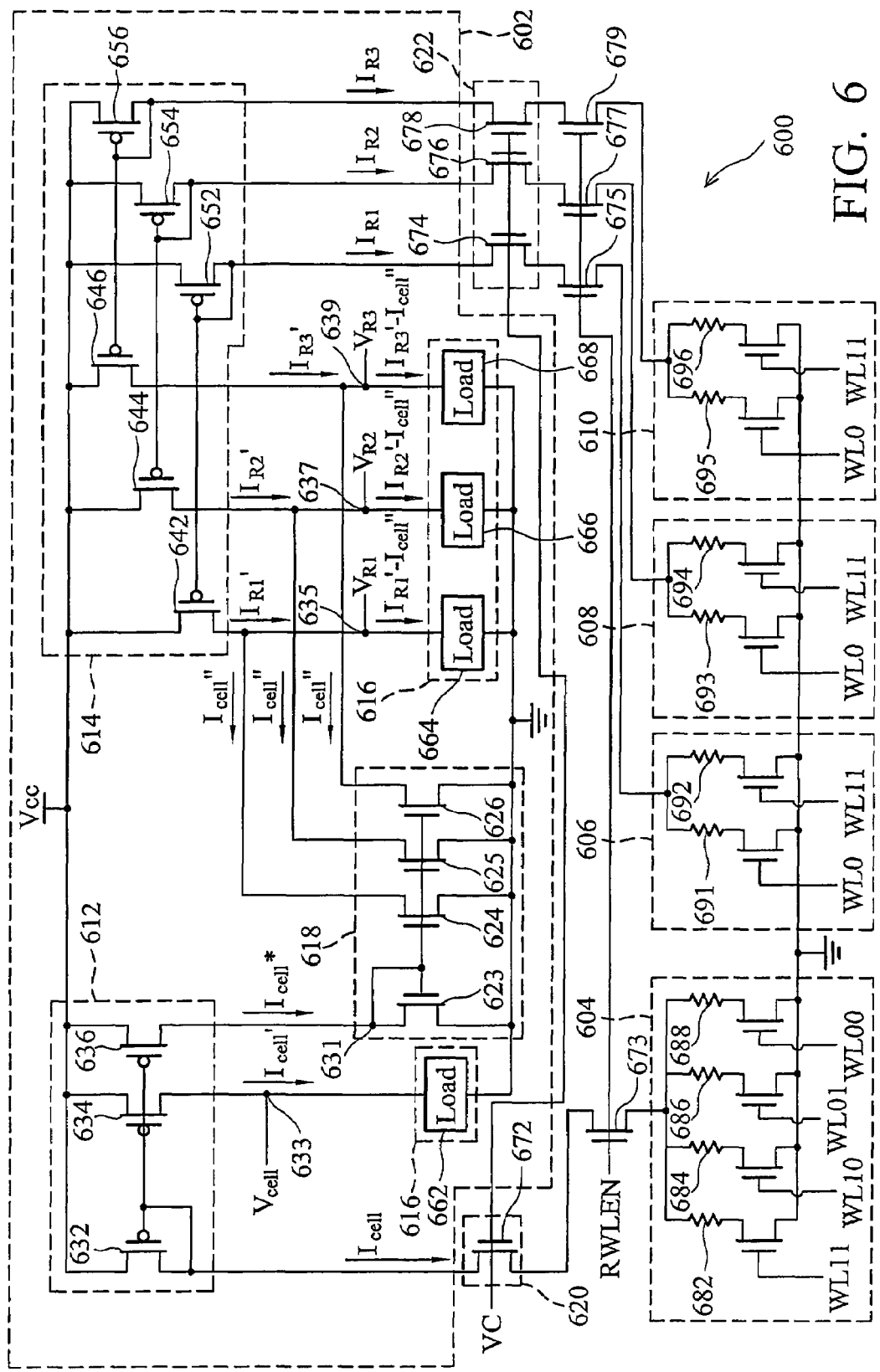
FIG. 6 is a circuit diagram of another embodiment of a portion of the circuits of an MRAM according to the invention.

FIG. 6 shows a portion of the circuits of an MRAM 600 according to the invention. Only the sense amplifier 602 of MRAM 600 differs from MRAM 300 in FIG. 3. The MRAM 600 includes a four-state sense amplifier 602, at least one four-state MRAM cell 604, and reference cells 606, 608, and 610. The sense amplifier 602 generates a memory cell voltage $V_{cell}$ and a plurality of reference voltages $V_{R1}$, $V_{R2}$, and $V_{R3}$ according to the resistance of the MRAM cell 604 and the reference cells 606, 608, and 610. The MRAM 600 further comprises the comparators 402, 404, and 406 and the decoder 408 shown in FIG. 4. After the sense amplifier 602 generates the memory cell voltage $V_{cell}$ and the reference voltages $V_{R1}$, $V_{R2}$, and $V_{R3}$, the memory cell voltage $V_{cell}$ and the reference voltages $V_{R1}$, $V_{R2}$, and $V_{R3}$ are processed by the comparators 402, 404, and 406 and the decoder 408 to obtain the data bits D0 and D1 stored in the MRAM cell 604.

The sense amplifier 602 comprises a first current mirror circuit 612, a second current mirror circuit 614, a third current mirror circuit 618, and a load circuit 616. The sense amplifier 602 differs from sense amplifier 302 only in the first current mirror circuit 612 and the third current mirror circuit 618. Additionally, the currents through the load circuit 616 have different levels from the currents through the load circuit 316. A PMOS transistor 636 is added to the first current mirror circuit 612. The PMOS transistors 634 and 636 have sources coupled to the voltage source Vcc and gates coupled to the gate of the PMOS transistor 632. The drain of the PMOS transistor 634 is coupled to a first node 633, and the drain of the PMOS transistor 636 is coupled to a third node 631. Because the voltages of the gates and sources of the PMOS transistors 632 and 634 are equal, the level of the second memory cell current $I_{cell}'$ generated by the PMOS transistor 634 is equal to the level of the first memory cell current $I_{cell}$ generated by the PMOS transistor 632. Accordingly, the level of the third memory cell current $I_{cell}^*$ generated by the PMOS transistor 636 is equal to the level of the first memory cell current $I_{cell}$ generated by the PMOS transistor 632.

The second current mirror circuit 614 functions identically to the second current mirror circuit 314. The PMOS transistors 642 and 652, 644 and 654, and 646 and 656 respectively form a current mirror generating one of the second reference currents $I_{R1}'$, $I_{R2}'$, and $I_{R3}'$ at the second nodes 635, 637, and 639 according to the first reference currents $I_{R1}$, $I_{R2}$, and $I_{R3}$ through the reference cells 606, 608, and 610, wherein the levels of the second reference currents $I_{R1}'$, $I_{R2}'$, and $I_{R3}'$ are respectively equal to the levels of first reference currents $I_{R1}$, $I_{R2}$, and $I_{R3}$. The third current mirror circuit 618 comprises NMOS transistors 623, 624, 625, and 626. The NMOS transistor 623 has a source coupled to the ground, and a gate and a drain coupled to the third node 631 for reception of the third memory cell current $I_{cell}^*$. The NMOS transistors 624, 625, and 626 have sources coupled to the ground, gates coupled to the gate of the NMOS transistor 623, and drains respectively coupled to the second nodes 635, 637, and 639. Because the voltages of the gates and the sources of the NMOS transistors 623, 624, 625, and 626 are equal, the level of the fourth memory cell currents $I_{cell}''$ drawn from the second nodes 635, 637, and 639 are equal to the level of the third memory cell current generated by the drain of the third memory cell current $I_{cell}*$, obtaining the remainder currents $(I_{R1}'-I_{cell1}'')$, $(I_{R2}'-I_{cell}'')$, and $(I_{R3}'-I_{cell}'')$ through the second nodes 635, 637, and 639, wherein the levels of the remainder currents are obtained by respectively subtracting the fourth memory cell current $I_{cell}''$ from the second reference currents $I_{R1}'$, $I_{R2}'$, and $I_{R3}'$.

The load circuit 616 provides equal loads for the second memory cell current $I_{cell}'$ and the remainder currents $(I_{R1}'-I_{cell}'')$, $(I_{R2}'-I_{cell}'')$, and $(I_{R3}'-I_{cell}'')$, and generates the memory cell voltage $V_{cell}$ at the first node 633 and the reference voltages $V_{R1}$, $V_{R2}$, and $V_{R3}$ at second nodes 635, 637, and 639. The load circuit 616 comprises load elements 662, 664, 666, and 668 with equal resistance, respectively coupled between the ground and the first node 633 and the second nodes 635, 637, and 639. Thus, the ratios of the reference voltages $V_{R1}$, $V_{R2}$, and $V_{R3}$ to the memory cell voltage $V_{cell}$ are respectively equal to the ratios of the remainder currents $(I_{R1}'-I_{cell}'')$, $(I_{R2}'-I_{cell}'')$, and $(I_{R3}'-I_{cell}'')$ to the second memory cell current $I_{cell}'$.

Figure 7:
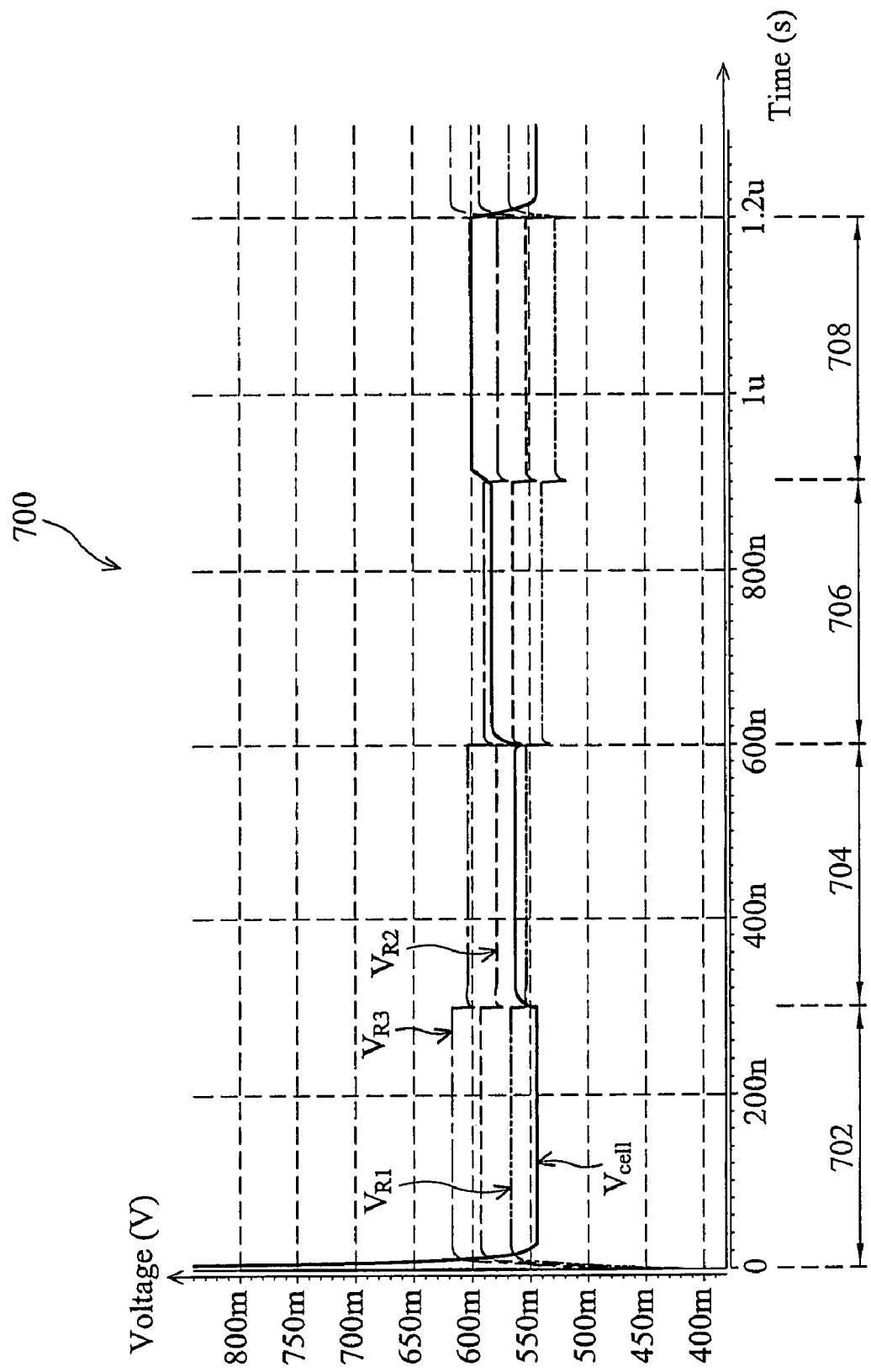
FIG. 7 shows a relationship between a memory cell voltage and the corresponding reference voltages generated by the sense amplifier of FIG. 6.

FIG. 7 shows a relationship between a memory cell voltage $V_{cell}$ and the corresponding reference voltages $V_{R1}$, $V_{R2}$, and $V_{R3}$ generated by the sense amplifier 602 of FIG. 6. During the periods 702, 704, 706, and 708, the word lines WL00, WL01, WL10, and WL11 are respectively enabled. Thus, the resistance of the MRAM cell 604 during the periods 702, 704, 706, and 708 is respectively the resistance of resistors 688, 686, 684, and 682. FIG. 7 shows that the relative levels between the memory cell voltage $V_{cell}$ and the corresponding reference voltages $V_{R1}$, $V_{R2}$, and $V_{R3}$ are different during the periods 702, 704, 706, and 708. Because the relative levels between the memory cell voltage $V_{cell}$ and the corresponding reference voltages $V_{R1}$, $V_{R2}$, and $V_{R3}$ reflect the relative levels of the resistance of the memory cell 604 and the reference cells 606, 608, and 610, the comparators 402, 404, and 406 and the decoder 408 can determine the resistance of the memory cell 604 in comparison with the resistance of the memory cells 606, 608, and 610 according to the memory cell voltage $V_{cell}$ and the corresponding reference voltages $V_{R1}$, $V_{R2}$, and $V_{R3}$, thus obtaining the data bits stored in the memory cell 604. Additionally, the sense amplifier 602 reduces access time of the memory cell 604 and improves performance of the MRAM 600.

Figure 8:
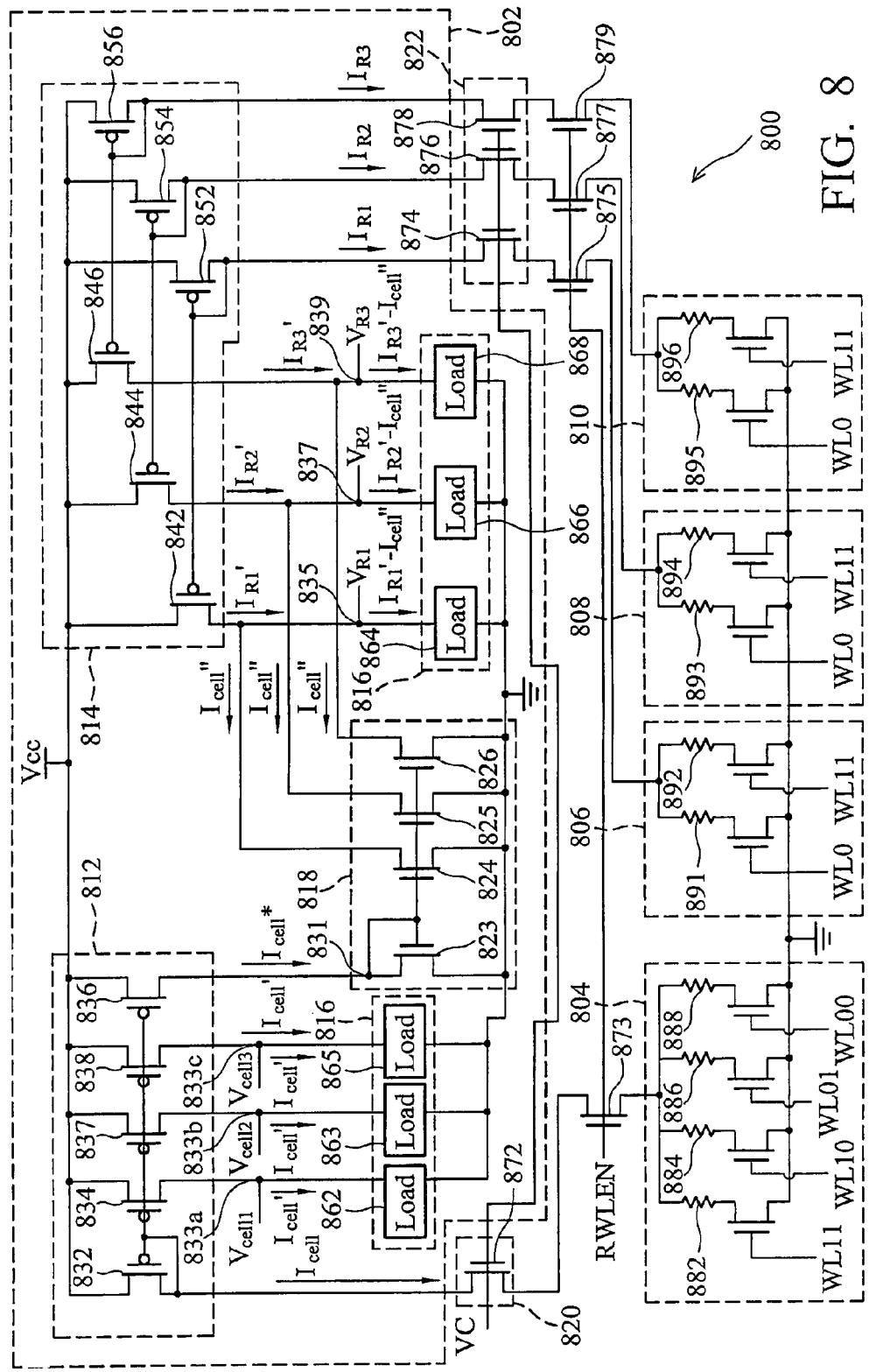
FIG. 8 is a circuit diagram of still another embodiment of a portion of the circuits of an MRAM according to the invention.
Figure 9:
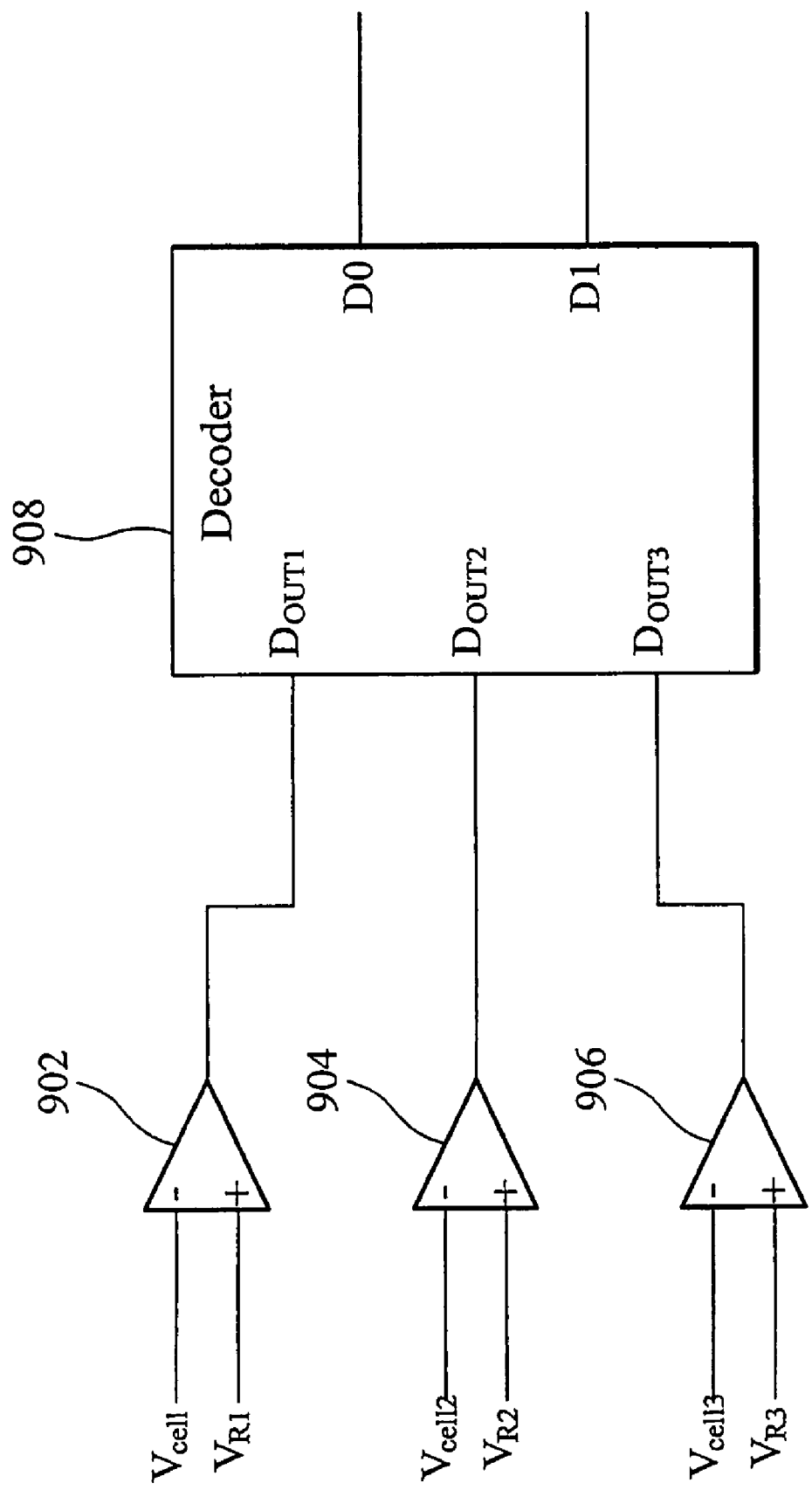
FIG. 9 shows comparators and a decoder comprised by the MRAMs of FIG. 8 according to the invention.

FIG. 8 shows a portion of the circuits of an MRAM 800 according to the invention. Only the sense amplifier 802 of MRAM 800 is different from MRAM 600 in FIG. 6. The MRAM 800 includes a four-state sense amplifier 802, at least one four-state MRAM cell 804, and reference cells 806, 808, and 810. The sense amplifier 802 generates a memory cell voltage $V_{cell}$ and a plurality of reference voltages $V_{R1}$, $V_{R2}$, and $V_{R3}$ according to the resistance of the MRAM cell 804 and the reference cells 806, 808, and 810. The MRAM 800 further comprises the comparators 902, 904, and 906 and the decoder 908 shown in FIG. 9. After the sense amplifier 802 generates the memory cell voltage $V_{cell}$ and the reference voltages $V_{R1}$, $V_{R2}$, and $V_{R3}$, the memory cell voltage $V_{cell}$ and the reference voltages $V_{R1}$, $V_{R2}$, and $V_{R3}$ are processed by the comparators 902, 904, and 906 and the decoder 908 to obtain the data bits D0 and D1 stored in the MRAM cell 804.

The sense amplifier 802 comprises a first current mirror circuit 812, a second current mirror circuit 814, a third current mirror circuit 818, and a load circuit 816. The sense amplifier 802 differs from sense amplifier 602 only in the first current mirror circuit 812 and the load circuit 816. Three PMOS transistors 834, 837, and 838 are added to the first current mirror circuit 812 to generate the second memory cell currents $I_{cell}'$ with the same current levels as the first memory cell current $I_{cell}$. The PMOS transistors 834, 837, and 838 have sources coupled to the voltage source Vcc and gates coupled to the gate of the PMOS transistor 832. The drains of the PMOS transistors 834, 837, and 838 are respectively coupled to first nodes 833a, 833b, and 833c. Because the voltages of the gates and sources of the PMOS transistors 834, 837, and 838 are equal, the levels of the second memory cell currents $I_{cell}'$ generated by the drains of the PMOS transistors 834, 837, 838, and 836 are equal to the level of the first memory cell current $I_{cell}$ generated by the PMOS transistor 832.

Three load elements 862, 863, and 865 are added to the load circuit 816 in comparison with the load circuit 616. The load elements 862, 863, and 865 are respectively coupled between one of the second nodes 833a, 833b, and 833c and the ground and respectively generates the memory cell voltages $V_{cell1}$, $V_{cell2}$, and $V_{cell3}$ according to the second memory cell current $I_{cell1}'$. The comparators 902, 904, and 906 then compare the memory cell voltages $V_{cell1}$, $V_{cell2}$, and $V_{cell3}$ with the reference voltages $V_{R1}$, $V_{R2}$, and $V_{R3}$ to generate the comparison result signals $D_{OUT1}$, $D_{OUT2}$, and $DOUT_3$. The decoder 908 then decodes the comparison results signals $D_{OUT1}$, $D_{OUT2}$, and $DOUT_3$ to obtain the 2-bit data D0 and D1 stored in the MRAM cell 804. Because the sense amplifier 802 of the MRAM 800 generates three memory cell voltages $V_{cell1}$, $V_{cell2}$, and $V_{cell3}$ as the input signals of the comparators 902, 904, and 906, the access time of the MRAM 800 is further reduced in comparison with the MRAM 600 of FIG. 6.

The invention provides an output circuit for memory. The output circuit comprises a sense amplifier, a plurality of reference cells, comparators, and a decoder. When an MRAM cell is selected, the MRAM transforms the resistance of the selected MRAM cell to corresponding 2-bit data with the sense amplifier, the comparators, and the decoder. The output circuit is not only suitable for MRAM, but also suitable for any memory composed of memory cells with changeable resistance, such as Phase Change Memory (PCM), to improve the performance thereof. Additionally, the output circuit can be used in any multiple-state memory. In one embodiment, if any memory cell of the memory stores N-bit data, an output circuit comprising an $2^N$-state sense amplifier and $(2^N-1)$ reference cells and comparators can be used to extract the N-bit data stored in specific memory cell of the memory.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multi-state sense amplifier, coupled to at least one memory cell with changeable resistance and a plurality of reference cells, comprising:
   a first current mirror circuit, coupled to the output terminal of the memory cell, generating a second memory cell current at a first node according to a first memory cell current through the memory cell;
   a second current mirror circuit, coupled to the output terminal of the reference cells, generating a plurality of second reference currents at a plurality of second nodes according to a plurality of first reference currents through the reference cells; and a load circuit, coupled to the first node, the second nodes, and a ground, providing equal loads for the second memory cell current and the second reference currents to respectively generate a memory cell voltage at the first node and a plurality of reference voltage at the second nodes;

wherein the level of the second memory cell current is twice the level of the first memory cell current, the levels of the second reference currents are the same as the levels of the first reference currents, and the ratios of the memory cell voltage to the reference voltages are equal to the ratios of the second memory cell current to the reference currents.

2. The multi-state sense amplifier as claimed in claim 1, wherein the first current mirror circuit comprises:
   a first P-type transistor, having a source coupled to a voltage source, and a gate and a drain coupled to the output terminal of the memory cell, and receiving the first memory cell current; and
   a second P-type transistor, having a source coupled to the voltage source, a gate coupled to the gate of the first P-type transistor, and a drain coupled to the first node, and generating the second memory cell current.

3. The multi-state sense amplifier as claimed in claim 1, wherein the second current mirror circuit comprises:
   a plurality of third P-type transistors, having sources coupled to a voltage source, and gates and drains respectively coupled to one of the output terminals of the reference cells, and receiving the first reference currents; and
   a plurality of fourth P-type transistors, having sources coupled to the voltage source, gates respectively coupled to one of the gates of the third P-type transistors, and drains respectively coupled to one of the second nodes, and generating the second reference currents.

4. The multi-state sense amplifier as claimed in claim 1, wherein the load circuit comprises:
   a first load element, coupled between the first node and the ground, receiving the second memory cell current to generate the memory cell voltage; and
   a plurality of second load elements, respectively coupled between one of the second nodes and the ground, receiving the second reference currents to generate the reference voltages.

5. The multi-state sense amplifier as claimed in claim 1, wherein a source follower is coupled between the first current mirror circuit and the output terminal of the memory cell for the generation of the first memory cell current.

6. The multi-state sense amplifier as claimed in claim 1, wherein a source follower circuit is coupled between the second current mirror circuit and the output terminals of the reference cells for the generation of the first reference currents.

7. The multi-state sense amplifier as claimed in claim 1, wherein the memory cell is a Magnetic Random Access Memory (MRAM) cell having $2^N$ steady resistance states, the reference cells have different resistances, and the number of the reference cells is $(2^N-1)$, wherein N is a number of the bits stored in the memory cell.

8. The multi-state sense amplifier as claimed in claim 1, wherein the memory cell is a memory cell having $2^N$ steady resistance states, wherein N is a number of the bits stored in the memory cell.

9. The multi-state sense amplifier as claimed in claim 1, wherein each of the reference cells is formed by coupling two resistors in parallel between the output terminals of the reference cells and a ground, and the resistors respectively correspond to one of the $2^N$ steady resistance states of the memory cell, wherein N is a number of the bits stored in the memory cell.

10. The multi-state sense amplifier as claimed in claim 1, wherein the multi-state sense amplifier is coupled to a plurality of comparators, each of which compares the memory cell voltage with one of the reference voltages to obtain a plurality of comparison result signals.

11. The multi-state sense amplifier as claimed in claim 10, wherein the comparators are coupled to a decoder decoding the comparison result signals to obtain data bits stored in the memory cell.

12. The multi-state sense amplifier as claimed in claim 1, wherein the level of the first memory cell current is determined according to the resistance of the memory cell, and the levels of the first reference currents are respectively determined according to the resistances of the reference cells.

13. A multi-state sense amplifier, coupled to at least one memory cell with changeable resistance and a plurality of reference cells, comprising:
    a first current mirror circuit, coupled to the output terminal of the memory cell, generating at least one second memory cell current at one first node and a third memory cell current at a third node according to a first memory cell current through the memory cell;
    a second current mirror circuit, coupled to the output terminal of the reference cells, generating a plurality of second reference currents at a plurality of second nodes according to a plurality of first reference currents through the reference cells;
    a third current mirror circuit, coupled to the third node and the second nodes, drawing a plurality of fourth memory cell currents equal to the third memory cell current from the second nodes to leave a plurality of remainder currents through the second nodes; and
    a load circuit, coupled to the first node, the second nodes, and a ground, providing equal loads for the second memory cell current and the remainder currents to respectively generate at least one memory cell voltage at the first node and a plurality of reference voltage at the second nodes;
    wherein the levels of the second memory cell current and the third memory cell currents are equal to the level of the first memory cell current, the levels of the second reference currents are equal to the levels of the first reference currents, the levels of the remainder currents are equal to the differences between the second reference currents and the fourth memory cell currents, and the ratios of the memory cell voltage to the reference voltages are equal to the ratios of the second memory cell current to the remainder currents.

14. The multi-state sense amplifier as claimed in claim 13, wherein the first current mirror circuit comprises:
    a first P-type transistor, having a source coupled to a voltage source, and a gate and a drain coupled to the output terminal of the memory cell, and receiving the first memory cell current;
    a second P-type transistor, having a source coupled to the voltage source, a gate coupled to the gate of the first P-type transistor, and a drain coupled to the first node, and generating the second memory cell current; and
    a third P-type transistor, having a source coupled to the voltage source, a gate coupled to the gate of the first P-type transistor, and a drain coupled to the third node, and generating the third memory cell current.

15. The multi-state sense amplifier as claimed in claim 13, wherein the second current mirror circuit comprises:

a plurality of fourth P-type transistors, having sources coupled to a voltage source, and gates and drains respectively coupled to one of the output terminals of the reference cells, and receiving the first reference currents; and a plurality of fifth P-type transistors, having sources coupled to the voltage source, gates respectively coupled to one of the gates of the fourth P-type transistors, and drains respectively coupled to one of the second nodes, and generating the second reference currents.

16. The multi-state sense amplifier as claimed in claim 13, wherein the third current mirror circuit comprises:

a first N-type transistor, having a source coupled to the ground, and a gate and a drain coupled to the third node, and receiving the third memory cell current; and a plurality of second N-type transistors, having sources coupled to the ground, gates coupled to the gate of the first N-type transistor, and drains respectively coupled to one of the second nodes, and drawing the fourth memory cell currents equal to the third memory cell current from the second nodes.

17. The multi-state sense amplifier as claimed in claim 13, wherein the load circuit comprises:

a first load element, coupled between the first node and the ground, receiving the second memory cell current to generate the memory cell voltage; and a plurality of second load elements, respectively coupled between one of the second nodes and the ground, receiving the remainder currents to generate the reference voltages.

18. The multi-state sense amplifier as claimed in claim 13, wherein a source follower is coupled between the first current mirror circuit and the output terminal of the memory cell for the generation of the first memory cell current.

19. The multi-state sense amplifier as claimed in claim 18, wherein a source follower circuit is coupled between the second current mirror circuit and the output terminals of the reference cells and keep the voltage drops across the reference cells identical to the voltage drop across the memory cell for the generation of the first reference currents.

20. The multi-state sense amplifier as claimed in claim 13, wherein the memory cell is a Magnetic Random Access Memory (MRAM) cell having $2^N$ steady resistance states, the reference cells have different resistances, and the number of the reference cells is $(2^N-1)$, wherein N is a number of the bits stored in the memory cell.

21. The multi-state sense amplifier as claimed in claim 13, wherein the memory cell is a memory cell having $2^N$ steady resistance states, wherein N is a number of the bits stored in the memory cell.

22. The multi-state sense amplifier as claimed in claim 13, wherein each of the reference cells is formed by coupling two resistors in parallel between the output terminals of the reference cells and a ground, and the resistors respectively correspond to one of the $2^N$ steady resistance states of the memory cell, wherein N is a number of the bits stored in the memory cell.

23. The multi-state sense amplifier as claimed in claim 13, wherein the multi-state sense amplifier is coupled to a plurality of comparators, each of which compares the memory cell voltage with one of the reference voltages to obtain a plurality of comparison result signals.

24. The multi-state sense amplifier as claimed in claim 23, wherein the comparators are coupled to a decoder decoding the comparison result signals to obtain data bits stored in the memory cell.

25. The multi-state sense amplifier as claimed in claim 13, wherein the level of the first memory cell current is determined according to the resistance of the memory cell, and the levels of the first reference currents are respectively determined according to the resistances of the reference cells.

26. The multi-state sense amplifier as claimed in claim 13, wherein the at least one first node is a plurality of first nodes, the at least one second memory cell current is a plurality of second memory cell currents, and the at least one memory cell voltage is a plurality of memory cell voltages.

27. The multi-state sense amplifier as claimed in claim 26, wherein the first current mirror circuit comprises:

a first P-type transistor, having a source coupled to a voltage source, and a gate and a drain coupled to the output terminal of the memory cell, and receiving the first memory cell current;

a plurality of second P-type transistors, having sources coupled to the voltage source, gates coupled to the gate of the first P-type transistor, and drains coupled to one of the first nodes, and generating the second memory cell currents; and a third P-type transistor, having a source coupled to the voltage source, a gate coupled to the gate of the first P-type transistor, and a drain coupled to the third node, and generating the third memory cell current.

28. The multi-state sense amplifier as claimed in claim 26, wherein the load circuit comprises:

a plurality of first load elements, respectively coupled between one of the first nodes and the ground, receiving the second memory cell currents to generate the memory cell voltages; and a plurality of second load elements, respectively coupled between one of the second nodes and the ground, receiving the remainder currents to generate the reference voltages.

29. The multi-state sense amplifier as claimed in claim 26, wherein the multi-state sense amplifier is coupled to a plurality of comparators which compare the memory cell voltages with the reference cell voltages to generate a plurality of comparison result signals.

30. The multi-state sense amplifier as claimed in claim 29, wherein the comparators are coupled to a decoder decoding the comparison result signals to obtain data bits stored in the memory cell.

* * * * *